US010529288B2

(12) United States Patent
Jung

(10) Patent No.: US 10,529,288 B2
(45) Date of Patent: Jan. 7, 2020

(54) ORGANIC LIGHT-EMITTING DISPLAY DEVICE AND DATA PROCESSING METHOD OF ORGANIC LIGHT-EMITTING DISPLAY DEVICE

(71) Applicant: LG DISPLAY CO., LTD., Seoul (KR)

(72) Inventor: Jae-Hoon Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 29 days.

(21) Appl. No.: 16/051,925

(22) Filed: Aug. 1, 2018

(65) Prior Publication Data
US 2019/0043430 A1 Feb. 7, 2019

(30) Foreign Application Priority Data

Aug. 3, 2017 (KR) .................. 10-2017-0098415

(51) Int. Cl.
G09G 3/3291 (2016.01)
H01L 27/32 (2006.01)
G09G 3/3233 (2016.01)

(52) U.S. Cl.
CPC ......... G09G 3/3291 (2013.01); G09G 3/3233 (2013.01); H01L 27/3262 (2013.01); G09G 2300/0819 (2013.01); G09G 2310/08 (2013.01); G09G 2320/0285 (2013.01); G09G 2320/0295 (2013.01); G09G 2320/045 (2013.01); G09G 2330/026 (2013.01); G09G 2370/08 (2013.01);
(Continued)

(58) Field of Classification Search
CPC ............... G09G 5/006; G09G 2370/04; G09G 2310/08; G09G 2320/0295; G09G 2320/045; G09G 2370/14; G09G 2300/0819; G09G 2320/0285; G09G 2330/026; G09G 3/2033; G09G 3/3291; H01L 27/3262; H01L 27/3276
See application file for complete search history.

(56) References Cited

U.S. PATENT DOCUMENTS 8,390,604 B2 * 3/2013 Ryu ..................... G09G 3/2096
345/204
2010/0110058 A1 * 5/2010 Moh ..................... G09G 3/3655
345/211

(Continued)

FOREIGN PATENT DOCUMENTS

| CN | 106531045 A | 3/2017 |
|---|---|---|
| KR | 10-2013-0032059 A | 4/2013 |
| KR | 10-2018-0131783 A | 12/2018 |

Primary Examiner — Lixi C Simpson
(74) Attorney, Agent, or Firm — Birch, Stewart, Kolasch & Birch, LLP

(57) ABSTRACT

The present invention relates to an organic light-emitting display device including a non-volatile memory in a panel part when the panel part is separated by a considerable distance from a timing control circuit such that the timing control circuit can be commonly used, and a data processing method of the organic light-emitting display device. A data driver of the panel part includes a memory and a converter and performs communication with the timing control circuit through a long-distance signal transmission system, or a bridge circuit board including a memory and a converter performs communication with the timing control circuit through a long-distance signal transmission system to transmit display panel compensation data, thereby commonly using the timing control circuit.

20 Claims, 9 Drawing Sheets

(52) U.S. Cl.
CPC ...... *G09G 2370/14* (2013.01); *H01L 27/3276* (2013.01)

(56) References Cited

U.S. PATENT DOCUMENTS

| | | | |
|---|---|---|---|
| 2011/0221760 A1* | 9/2011 | Irie | G09G 3/3648 345/589 |
| 2013/0100121 A1* | 4/2013 | Cha | H04N 19/597 345/419 |
| 2015/0279324 A1* | 10/2015 | Ohta | G09G 3/3283 345/690 |
| 2016/0125840 A1* | 5/2016 | Oh | G09G 5/008 345/213 |

* cited by examiner

ORGANIC LIGHT-EMITTING DISPLAY DEVICE AND DATA PROCESSING METHOD OF ORGANIC LIGHT-EMITTING DISPLAY DEVICE

This application claims the priority benefit of Korean Patent Application No. 10-2017-0098415, filed in the Republic of Korea on Aug. 3, 2017, which is hereby incorporated by reference as if fully set forth herein.

BACKGROUND OF THE INVENTION

Field of the Invention

The present invention relates to an organic light-emitting display device and a data processing method of the organic light-emitting display device and, more specifically, to an organic light-emitting display device including a non-volatile memory in a panel part when the panel part is separated by a considerable distance from a timing control circuit such that the timing control circuit can be commonly used, and a data processing method of the organic light-emitting display device.

Discussion of the Related Art

An organic light-emitting diode display device is a display device having an organic light-emitting diode (OLED) which is a spontaneous light-emitting element included in a pixel. The OLED display device has lower power consumption than a liquid crystal display device that requires a backlight and can be manufactured thinner than the liquid crystal display device. In addition, the OLED display device has advantages of a wide viewing angle and a high response speed. Process technology for the OLED display device has been developed to reach a large-screen mass production level and thus is extending the market while competing with liquid crystal displays.

FIG. 1 is a circuit diagram for describing a pixel structure of an OLED display device according to a related art. Referring to FIG. 1, each pixel of the OLED display panel includes a first switching TFT ST1, a second switching TFT ST2, a driving TFT DT, a capacitor Cst and an organic light-emitting diode OLED.

The first switching TFT ST1 is switched by a scan signal scan (or gate signal) supplied through a gate line GL to supply data voltage Vdata supplied through a data line DL to the driving TFT DT.

The driving TFT DT is switched by the data voltage Vdata supplied from the first switching transistor ST1 to control a data current Ioled which flows from a first driving power VDD supplied to a power line PL to the organic light-emitting diode OLED.

The capacitor Cst is connected between the gate terminal and the source terminal of the driving TFT DT, stores a voltage corresponding to the data voltage Vdata supplied to the gate terminal of the driving TFT DT and turns the driving TFT DT on with the stored voltage.

The pixel includes a sensing signal line SL formed in the same direction as the direction of the gate line GL. The second switching TFT ST2 is switched by a sense signal sense applied to the sensing signal line SL to supply the data current Ioled applied to the organic light-emitting diode OLED to an analog-to-digital converter (ADC) of a drive IC.

The organic light-emitting diode OLED is electrically connected between the source terminal of the driving TFT DT and a cathode power source VSS and emits light according to the data current Ioled supplied from the driving TFT DT.

Each pixel of the OLED display device displays a predetermined image by controlling the magnitude of the data current Ioled flowing from the first driving power VDD to the organic light-emitting diode OLED using switching of the driving TFT DT according to the data voltage Vdata to cause the organic light-emitting diode OLED to emit light.

However, there is a problem in that the threshold voltage Vth/mobility of the driving TFT DT and characteristics of the organic light-emitting diode OLED are different for respective pixels due to non-uniformity of a TFT manufacturing process. Accordingly, in a normal OLED display device, uniform picture quality cannot be realized due to deviation of currents flowing through organic light-emitting diodes even when the same data voltage Vdata is applied to the driving TFTs of pixels.

To address the problem with respect to nonuniform threshold voltages Vth/mobilities of the driving TFTs and non-uniform characteristics of the organic light-emitting diodes OLED due to manufacturing process deviation, it is necessary to perform compensation to obtain a uniform threshold voltage/mobility of the driving TFTs and uniform characteristics of the organic light-emitting diodes OLED for all pixels.

For this reason, research for improving device stability and appropriately compensating for device variation has been conducted, and a current programming method for driving TFTs with less influence of Vth in an initial stage or digital compensation suitable for a small size was used in order to supply a current independent of characteristic variation in TFTs and OLEDs to pixels.

Pixel compensation technology is divided into an internal compensation circuit and an external compensation circuit. A voltage programming method of the internal compensation circuit, which is most widely used, is characterized in that a driving TFT which drives current in a pixel is controlled by a voltage corresponding to an input image applied to the gate. This method senses and compensates for a Vth deviation of the driving TFT and is divided into a diode connection method and a source follower method.

FIG. 2 shows a compensation circuit of a voltage programming method developed for OLED displays according to a related art to address a TFT panel luminance non-uniformity problem. The circuit, which has a structure in which TFTs, a capacitor and a control signal line are added to compensate for TFT deviation, is composed of 5 TFTs and one capacitor and is implemented on an oxide semiconductor TFT substrate.

For a high-definition panel, a compensation circuit having a simpler structure is required, and thus a power switching structure for reducing the number of control circuits was presented. FIG. 3 shows an internal compensation circuit having a different configuration. This compensation circuit is composed of 2 TFTs and 2 capacitors and thus has an advantage of simple pixel structure and can compensate for mobility. This compensation circuit switches power ELVDD instead of reducing the number of control circuits and thus it is difficult to apply the compensation circuit to high-definition TVs because it is difficult to rapidly switch power of a large screen in reality and power consumption increases due to switching.

The external compensation circuit is a compensation method of providing a minimum number of pixel circuits inside a panel and providing a circuit for compensating for driving TFTs outside the panel. FIG. 4 shows a simplified external compensation circuit according to a related art. This circuit operates in such a manner that an external circuit to which an algorithm is applied senses characteristics of driving TFTs included in the panel and performs compensation in a data voltage application period. This compensation circuit can simplify the pixel configuration by reducing the number of TFTs of pixels in the panel and the number of driving signals to avoid complicated timing and achieve high-speed operation. In addition, a reduction in the number of signals due to a reduction in the number of switch TFTs can increase yield, compared to the internal compensation circuit. Various compensation functions can be applied through programming of the algorithm of the external circuit, and thus Vth and mobility of driving TFTs and OLED voltage variation can be compensated.

In general, the external compensation circuit is implemented as a timing control circuit of an OLED display device and compensation data necessary for external compensation is stored in a memory included in the timing control circuit.

The timing control circuit can have a fault when the OLED display device is manufactured or used. To handle the fault, the timing control circuit needs to be changed.

External compensation data stored in the timing control circuit is one-to-one matched with a display panel module. When a timing control circuit in which data other than matched compensation data is stored is used, normal compensation is not performed. When a new timing control circuit is connected to an existing display panel and the display panel is operated, abnormality can be generated in a display screen.

Accordingly, when the timing control circuit is replaced, a long time is taken to sense and compensate for the OLED display device in order to store new compensation data for external compensation in a memory connected to the timing control circuit, and thus manufacturing efficiency or repair efficiency deteriorates and cost increases.

Due to such problems, there is demand for a display device which includes a non-volatile memory in a data driver of a display panel to store display compensation data and can store the display compensation data in a replaced timing control circuit.

Meanwhile, a model in which a timing control circuit is separated by a considerable distance from a display module has recently been proposed as a commercial display device. When the timing control circuit is replaced in such a display device, a problem occurs in transmission of data stored in the data driver of the display panel to the timing control circuit.

That is, since a communication speed problem occurs due to the distance between the data driver and the timing control circuit, long-distance transmission cannot be performed using conventional data processing methods.

SUMMARY OF THE INVENTION

An object of the present invention is to provide an organic light-emitting display device including a non-volatile memory for storing display panel compensation data in a display panel such that a timing control circuit can be commonly used and a data processing method of the organic light-emitting display device.

Another object of the present invention is to provide an organic light-emitting display device capable of performing data processing in a structure in which a timing control circuit is separated by a considerable distance from a display panel and a data processing method of the organic light-emitting display device.

To accomplish the objects, an organic light-emitting display device according to an embodiment of the present invention includes a panel part including a display panel in which a plurality of data lines, a plurality of gate lines and a plurality of sub-pixels are arranged, a data driver for driving the data lines, and a gate driver for driving the gate lines; and a timing control circuit outputting a signal for controlling the data driver and the gate driver of the panel part, wherein the data driver includes a first memory for storing data including display panel compensation data; and a converter configured to perform communication with the timing control circuit through a long-distance signal transmission system, to convert a signal provided from the timing control circuit and transmit the converted signal to the first memory, and to convert a signal provided from the first memory and transmit the converted signal to the timing control circuit.

An organic light-emitting display device according to another embodiment of the present invention includes a panel part including a display panel in which a plurality of data lines, a plurality of gate lines and a plurality of sub-pixels are arranged, a data driver for driving the data lines and a gate driver for driving the gate lines; a timing control circuit outputting a signal for controlling the data driver and the gate driver of the panel part; and a bridge circuit board including a first memory for storing data including display panel compensation data, and a converter configured to perform communication with the timing control circuit through a long-distance signal transmission system, to convert a signal provided from the timing control circuit and transmit the converted signal to the first memory and, to convert a signal provided from the first memory and transmit the converted signal to the timing control circuit.

According to a preferred embodiment of the present invention, the organic light-emitting display device uses LVDS as long-distance signal transmission system.

According to a preferred embodiment of the present invention, the organic light-emitting display device uses a NAN type flash memory as the first memory.

In the organic light-emitting display device according to a preferred embodiment of the present invention, the converter includes a memory control circuit for controlling the first memory; an encoder for encoding data according to a control signal of the memory control circuit; a decoder for decoding data according to a control signal of the memory control circuit; a serializer for converting parallel electric signals into serial electric signals in a long-distance signal transmission format in order to transmit data to the timing control circuit; and a de-serializer for converting serial electric signals received from the timing control circuit through the long-distance signal transmission system into parallel electric signals.

In the organic light-emitting display device according to a preferred embodiment of the present invention, the converter can receive sensing data of sub-pixels, provided through the data driver of the panel part.

In the organic light-emitting display device according to a preferred embodiment of the present invention, the converter can receive temperature sensing data provided from a temperature sensor included in the panel part.

In the organic light-emitting display device according to a preferred embodiment of the present invention, the organic light-emitting display device further includes a second memory connected to the timing control circuit for storing data provided from the converter.

In the organic light-emitting display device according to preferred embodiments of the present invention, the second memory is a NAND type flash memory.

In the organic light-emitting display device according to a preferred embodiment of the present invention, when the converter receives a reset signal, the converter can compare a checksum of data stored in the first memory with a checksum of data stored in the second memory, and when there is a difference between the checksums, control the data stored in the first memory to be stored in the second memory.

In the organic light-emitting display device according to a preferred embodiment of the present invention, the converter can read final data stored in the second memory and store the final data in the first memory upon reception of a power off control signal from the timing control circuit.

According to a preferred embodiment of the present invention, a data processing method of an organic light-emitting display device including: a panel part including a display panel in which a plurality of data lines, a plurality of gate lines and a plurality of sub-pixels are arranged, a data driver for driving the data lines and a gate driver for driving the gate lines; and a timing control circuit outputting a signal for controlling the data driver and the gate driver of the panel part, the panel part including a first memory for storing data including display panel compensation data and a converter for controlling data communication with the timing control circuit, the data processing method including an initialization step of converting display panel compensation data of the organic light-emitting display device, stored in the first memory, into data of a long-distance signal transmission system and transmitting the converted data to a second memory of the timing control circuit when the converter recognizes a booting mode of the timing control circuit due to timing control circuit change; and a data processing step of receiving a control signal from the timing control circuit and performing an operation corresponding to the control signal by the converter.

In the data processing method of the organic light-emitting display device according to an embodiment of the present invention, the initialization step can include checking checksums of data stored in the first memory and data stored in the second memory, converting the data stored in the first memory into data of the long-distance signal transmission system, and transmitting the converted data to the second memory of the timing control circuit when the converter receives a reset control signal from the timing control circuit.

In the data processing method of the organic light-emitting display device according to a preferred embodiment of the present invention, the data processing step can include receiving data converted into data of the long-distance signal transmission system by the timing control circuit and stored in the second memory, and storing the received data in the first memory when the converter receives a power off control signal from the timing control circuit.

The organic light-emitting display device and the data processing method thereof according to the present invention have the following advantages.

First, the timing control circuit can be commonly used by storing display panel compensation data in the display panel.

Second, data transmission can be performed in a display device in which the display panel is separated by a considerable distance from the timing control circuit.

DETAILED DESCRIPTION OF THE INVENTION

Figure 1:
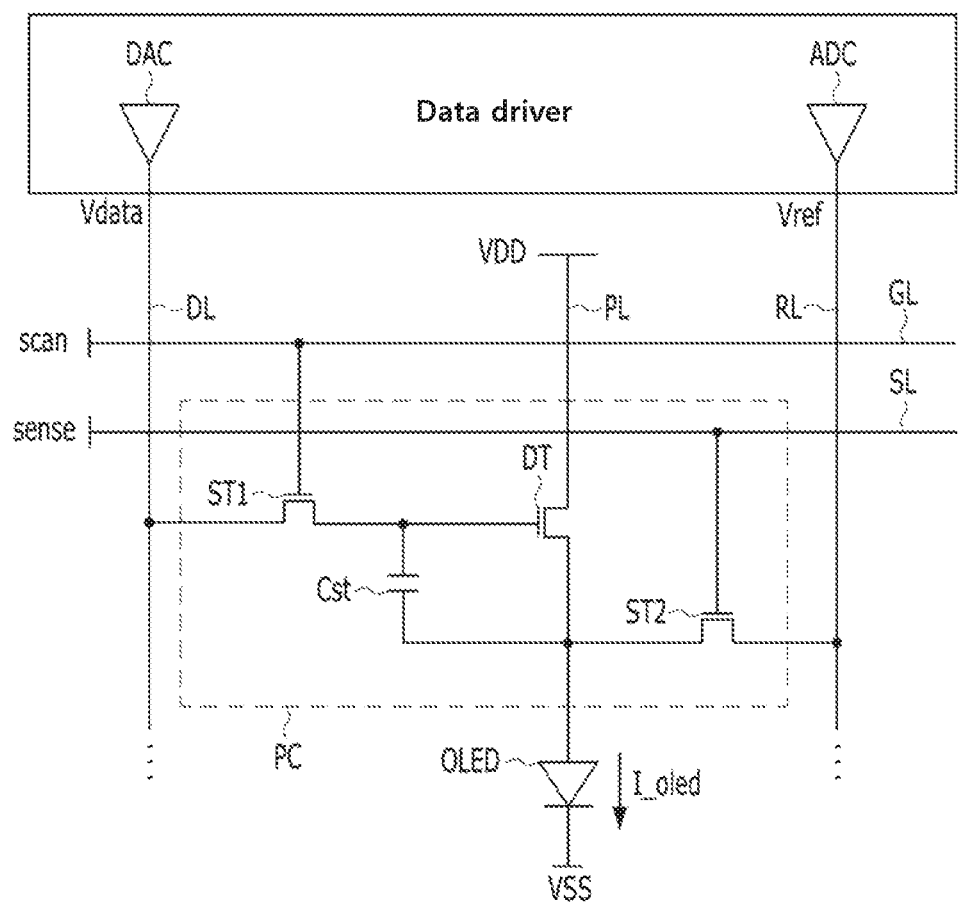
FIG. 1 is a circuit diagram for describing a pixel structure of an OLED display device.
Figure 2:
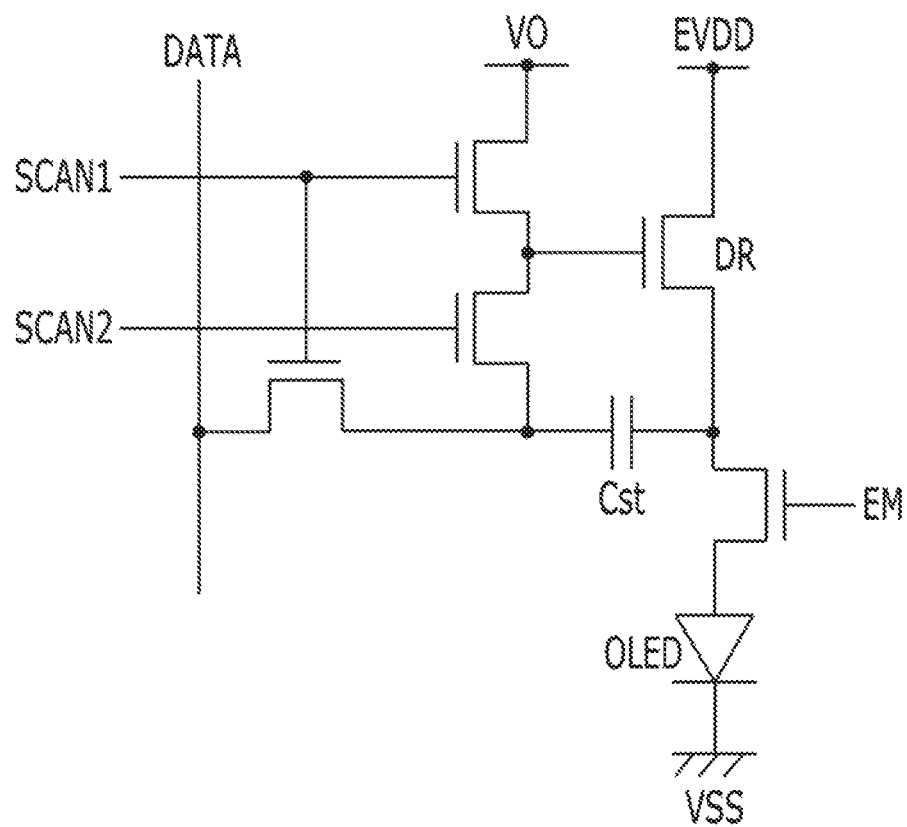
FIG. 2 is a circuit diagram showing an example of an internal compensation circuit of a voltage programming method.
Figure 3:
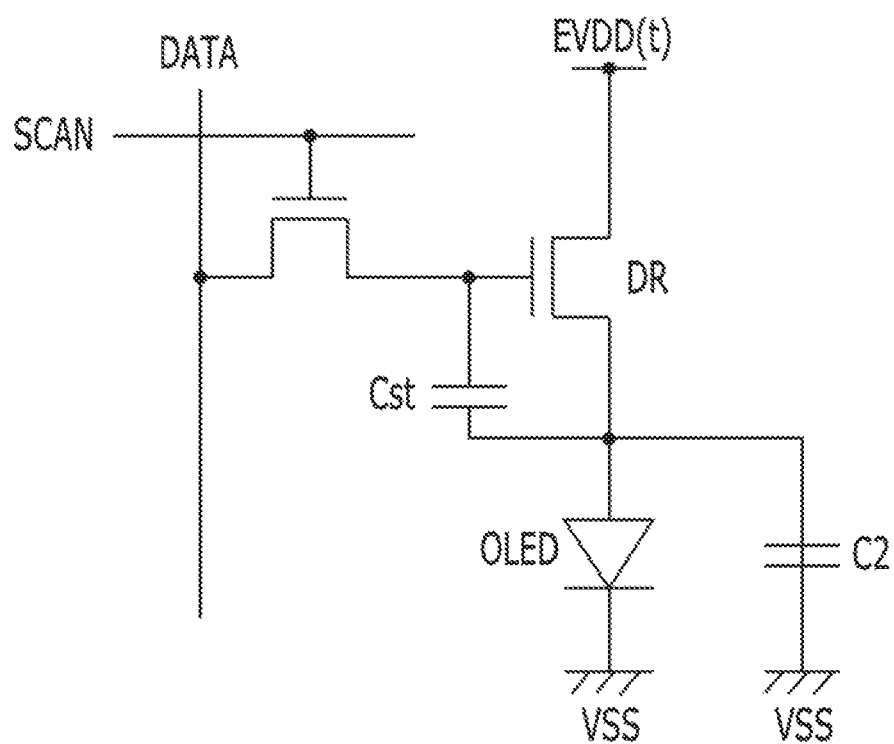
FIG. 3 is a circuit diagram of an internal compensation circuit having a different configuration.
Figure 4:
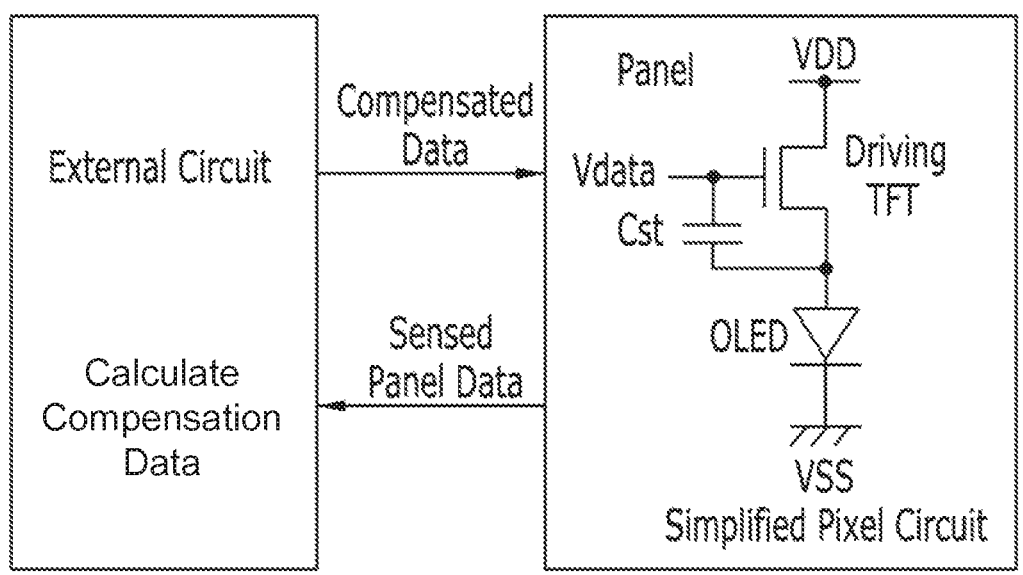
FIG. 4 is a diagram illustrating a simplified external compensation circuit.

Specific structural and functional descriptions with respect to embodiments of the present invention disclosed below are for the purpose of explaining the embodiments of the present invention, and the present invention can be embodied in various forms and is not limited to the embodiments described below.

The present invention can be modified in various ways and embodied in many alternate forms. Accordingly, while the embodiments are susceptible to various modifications and alternative forms, specific embodiments thereof are shown by way of example in the drawings and will herein be described in detail. It should be understood, however, that there is no intent to limit the embodiments to the particular forms disclosed, but on the contrary, the embodiments are to cover all modifications, equivalents, and alternatives falling within the spirit and scope of the disclosure.

Although terms such as, for example, "first" and "second" can be used to describe various elements, the elements should not be limited by these terms. These terms are merely used to distinguish the same or similar elements from each other. For example, a first component can be called a second component and, similarly, the second component can be called the first component without departing from the scope of the present invention.

When an element is "coupled" or "connected" to another element, it should be understood that a third element can be present between the two elements although the element can be directly coupled or connected to the other element. When an element is "directly coupled" or "directly connected" to another element, it should be understood that no element is present between the two elements. Other representations describing relationships between components, that is, "between", "directly between" or "adjacent to" and "directly adjacent to" should be understood in the same manner.

The terms used in the specification are for the purpose of describing specific embodiments and are not intended to limit the present invention. The singular forms are intended to include the plural forms as well unless the context clearly indicates otherwise. It will be further understood that the terms "comprises" or "includes" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments pertain. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Meanwhile, when a certain embodiment can be realized in a different manner, a function or an operation specified in a specific block can be executed in an order different from that specified in a flowchart. For example, two consecutive blocks can be simultaneously executed or can be executed in reverse depending on the related function or operation.

Hereinafter, preferred embodiments of the present invention will be described with reference to the attached drawings.

Figure 5:
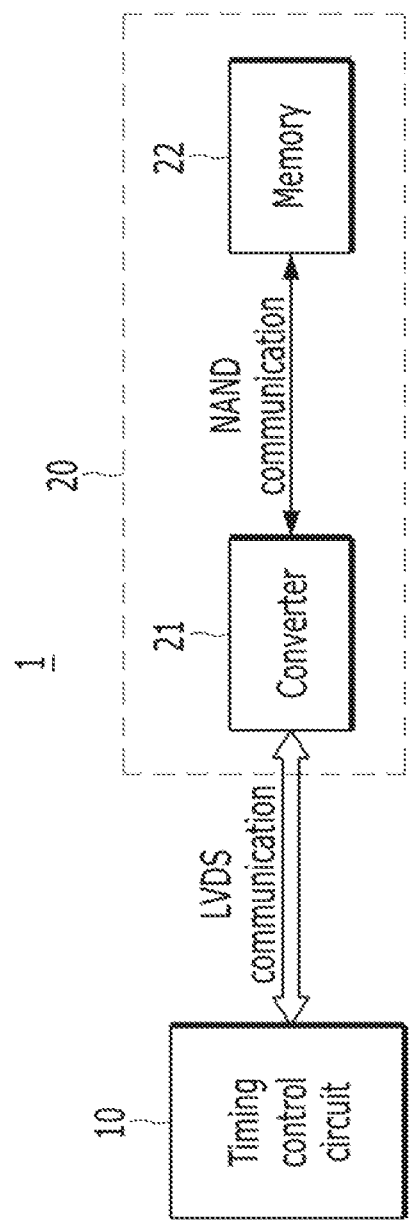
FIG. 5 is a diagram schematically illustrating a configuration of an organic light-emitting display device according to the present invention.

FIG. 5 is a diagram schematically illustrating a configuration of an organic light-emitting display device according to an embodiment of the present invention. All the components of the organic light-emitting display device according to all embodiments of the present invention are operatively coupled and configured.

As shown in FIG. 5, an organic light-emitting display device 1 according to the present invention includes a timing control circuit 10 and a panel part 20. The panel part 20 includes a memory 22 for storing data including display panel compensation data, and a converter 21 which is provided between the timing control circuit 10 and the memory and configured for data communication through a long-distance signal transmission system. The converter 21 transmits/receives data to/from the timing control circuit 10 through the long-distance signal transmission system. The long-distance signal transmission system includes CML and LVDS (Low-voltage differential signaling). In embodiments of the present invention, LVDS is exemplified as the long-distance signal transmission system.

Figure 6:
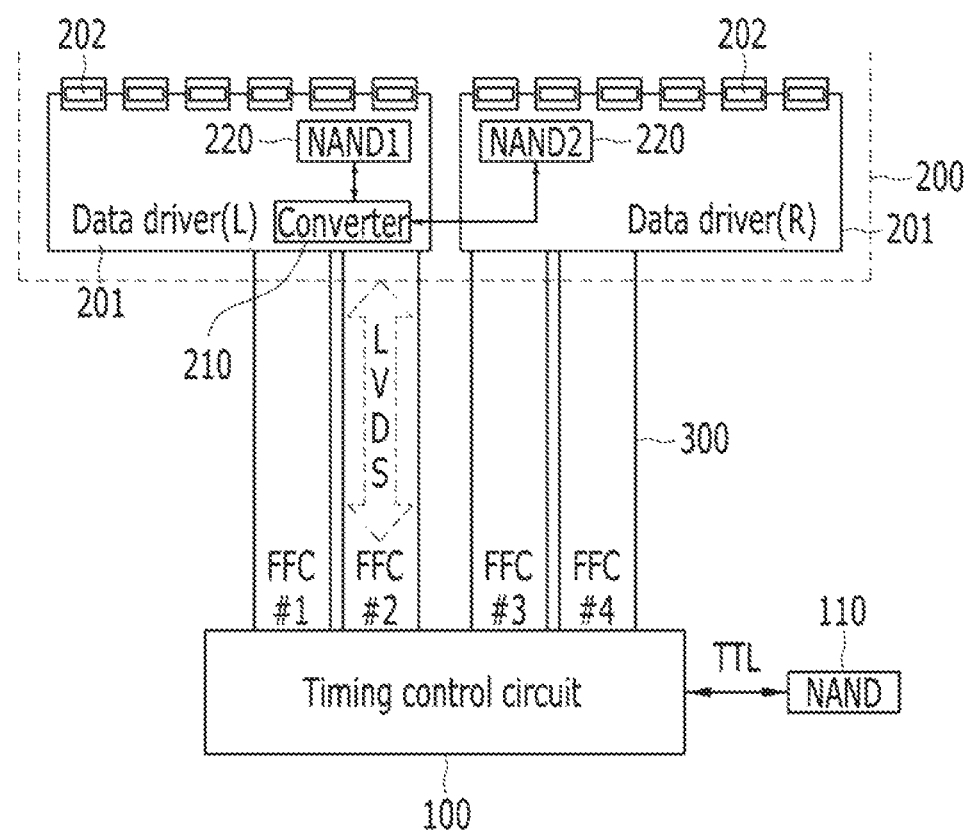
FIG. 6 is a diagram schematically illustrating a configuration of an organic light-emitting display device according to an embodiment of the present invention.

FIG. 6 is a diagram schematically illustrating a configuration of an organic light-emitting display device according to an embodiment of the present invention. That is, an embodiment in which a converter and a memory are configured in a data driver of a display panel part is illustrated as an example.

Referring to FIG. 6, a timing control circuit 100 provides power or video data and control data to a display panel part 200 using a plurality of flexible flat cables (FFC) 300. In addition, the timing control circuit 100 receives sensing data of sub-pixels from the display panel part 200 for display compensation.

The display panel part 200 includes a display panel in which a plurality of data lines, a plurality of gate lines and a plurality of sub-pixels are arranged. A data driver 201 to which a plurality of driving ICs 202 is connected is arranged on the left (L) and Right® of the panel in order to drive the data lines. The present invention is not limited to the embodiment in which the left and right data drivers 201 are configured.

The data driver 201 includes a first memory 220 for storing data including display panel compensation data, and a converter 210 which performs communication with the timing control circuit 100 through a long-distance signal transmission system, converts a signal provided from the timing control circuit and transmits the converted signal to the first memory 220, converts a signal provided from the first memory 220 and transmits the converted signal to the timing control circuit 100.

Preferably, a NAND type flash memory is used as the first memory 220. NAND type flash memories (for example, NAND1 and NAND2) can be respectively arranged in the left data driver L and the right data driver R.

Furthermore, a NAND type flash memory 110 can be connected to the timing control circuit 100. This is for the purpose of storing data necessary for operation of the timing control circuit 100, as described above. This is optional.

Figure 7:
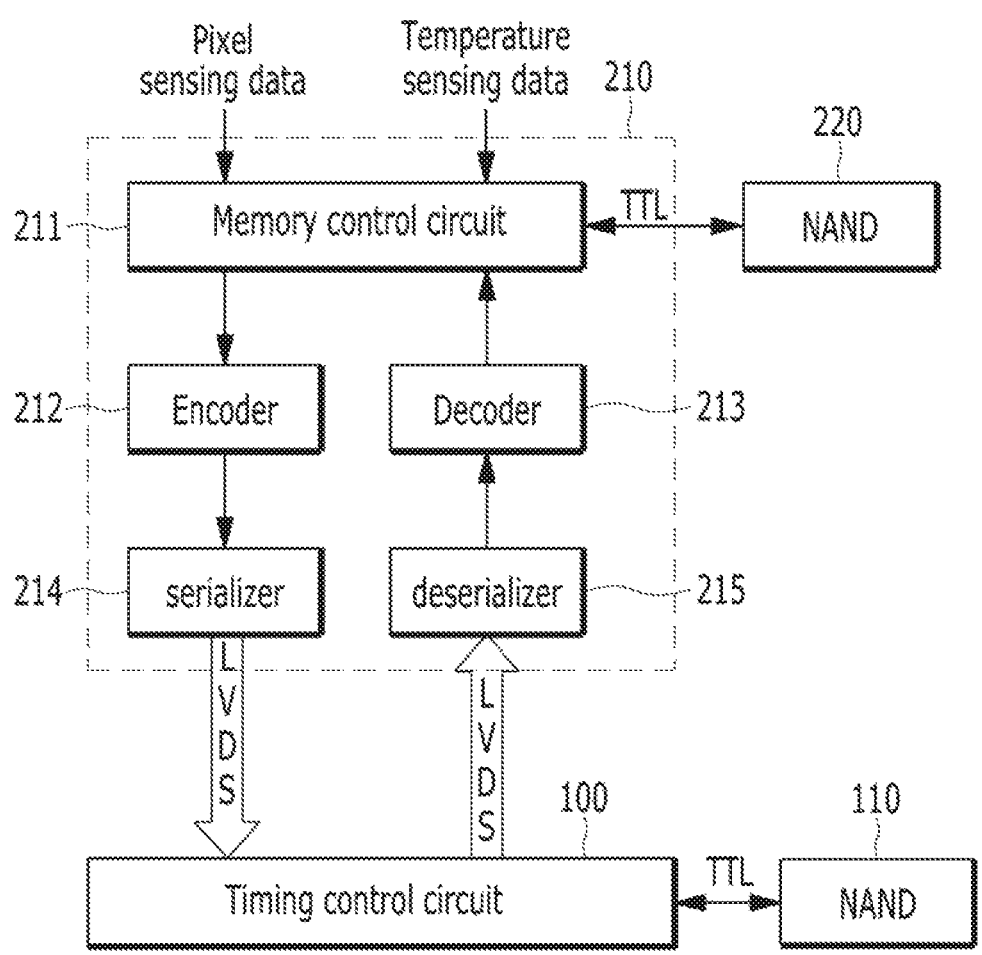
FIG. 7 is a diagram illustrating a configuration of a converter of FIG. 6 in detail.

FIG. 7 is a diagram illustrating a configuration of the converter of FIG. 6 in detail. As shown, the converter 210 includes a memory control circuit 211 for controlling the first memory 220, an encoder 212 for encoding data according to a control signal of the memory control circuit 211, a decoder 213 for decoding data according to a control signal of the memory control circuit 211, a serializer 214 for converting parallel electric signals into serial electric signals in a long-distance signal transmission format in order to transmit data to the timing control circuit 100, and a deserializer 215 for converting serial electric signals received from the timing control circuit 100 through a long-distance signal transmission system into parallel electric signals.

The converter 210 can receive sensing data of sub-pixels, provided through the data driver 201 of the panel part 200, and/or temperature sensing data provided from a temperature sensor included in the panel part. The received sensing data and temperature sensing data are transmitted to the timing control circuit 100 and used as sensing information for generating a compensation control signal of the timing control circuit 100.

Figure 8:
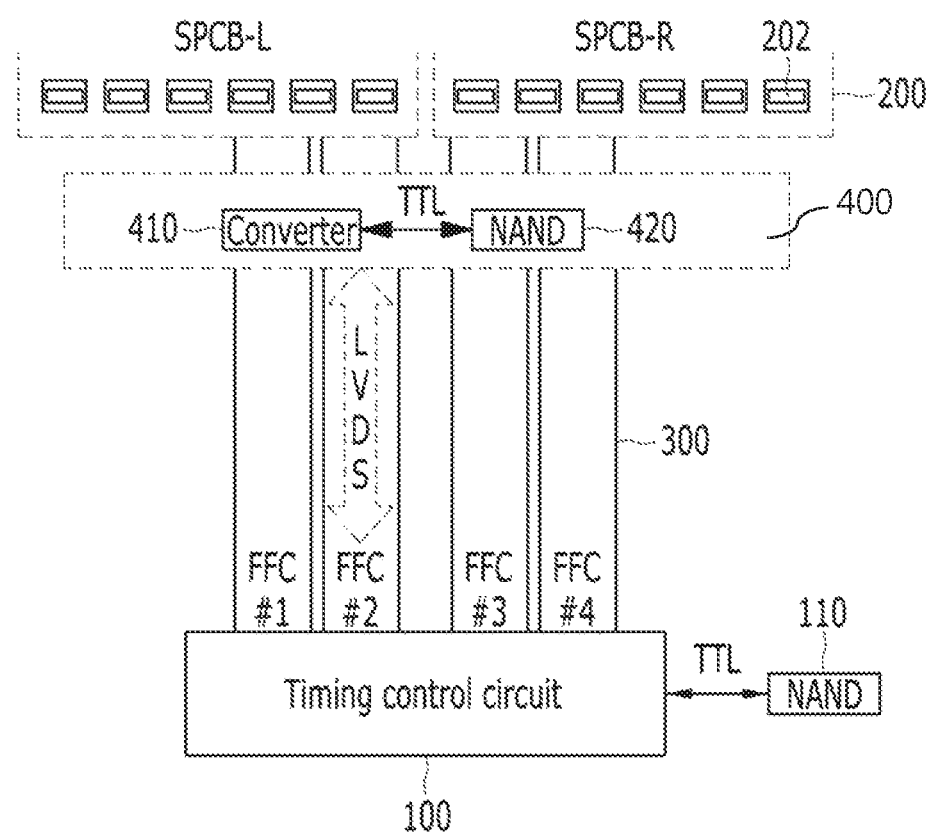
FIG. 8 is a diagram schematically illustrating a configuration of an organic light-emitting display device according to another embodiment of the present invention.

FIG. 8 is a diagram schematically illustrating a configuration of an organic light-emitting display device according to another embodiment of the present invention.

Referring to FIG. 8, the organic light-emitting display device includes a panel part 200 including a display panel in which a plurality of data lines, a plurality of gate lines and a plurality of sub-pixels are arranged, a data driver for driving the data lines, and a gate driver for driving the gate lines, a timing control circuit 100 outputting signals for controlling the data driver and the gate driver of the panel part, and a bridge circuit board 400 including a first memory 420 for storing data including display panel compensation data and a converter 410 which performs communication with the timing control circuit 100 through a long-distance signal transmission system, converts a signal provided from the timing control circuit 100 and transmits the converted signal to the first memory 420, and converts a signal provided from the first memory 420 and transmits the converted signal to the timing control circuit 100.

As described above, the embodiments of the present invention arrange the NAND type flash memory for storing data such as display panel compensation data in the display panel part 200 such that the timing control circuit 100 can be commonly used. In addition, data can be processed through a long-distance signal transmission system even when a distance between the timing control circuit 100 and the display panel part 200 is longer than 2 meters as in a commercial display device.

Figure 9:
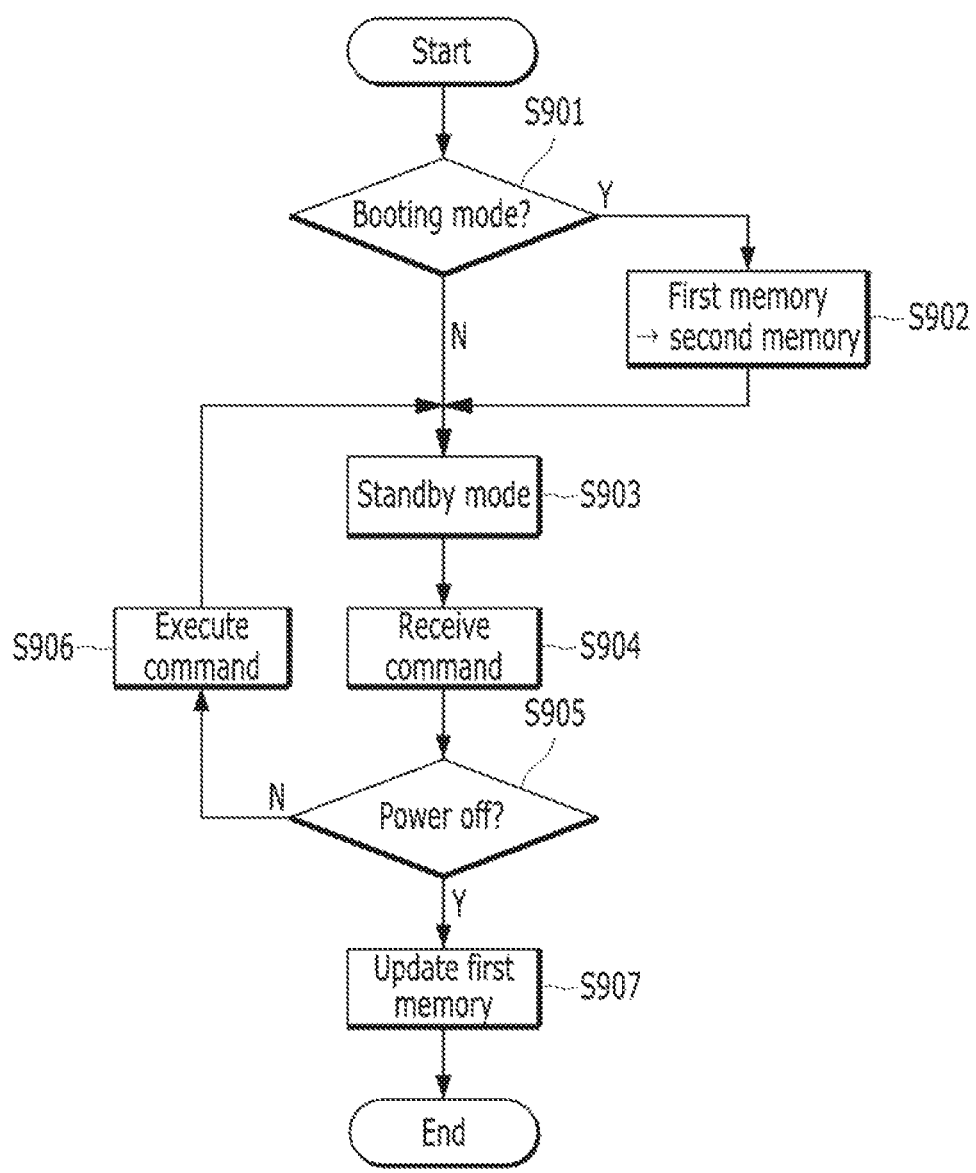
FIG. 9 is a flowchart illustrating a process flow of a data processing method of an organic light-emitting display device according to the present invention.

FIG. 9 is a flowchart illustrating a process flow of a data processing method of an organic light-emitting display device according to an embodiment of the present invention.

Referring to FIG. 9, the timing control circuit can have abnormality and thus can be changed. Here, the converter performs an initialization process. That is, a booting mode due to resetting of the timing control circuit can be recognized. Recognition of the booting mode is performed by comparing a checksum of data stored in the second memory 110 connected to the timing control circuit 100 with a checksum of data stored in the first memory 220 of the display panel part 200 or the first memory 420 of the bridge circuit board 400, when the converter receives a reset signal. If the checksums are different from each other, it is recognized that the timing control circuit 100 has been changed (S901). The display compensation data stored in the first memory 220 is converted into the LVDS format using the serializer 214. The converted data is transmitted to the timing control circuit 100 and stored in the second memory 110 (S902).

When the timing control circuit is not in the booting mode or after the initialization process is completed, the display device switches to a standby mode in which the converter receives a control signal from the timing control circuit (S903).

When a command is received from the timing control circuit 100 (S904), it is determined whether the received signal is a power off signal (S905). If the received signal is not the power off signal, the command is executed (S906). That is, sensing data of sub-pixels provided through the data driver of the panel part is transmitted to the timing control circuit 100 or temperature sensing data provided from the temperature sensor included in the panel part is transmitted to the timing control circuit 100. In addition, the control signal provided from the timing control circuit 100 is transmitted to the gate driver and the data driver of the display panel part.

When the command received from the timing control circuit 100 is recognized as the power off signal, the display panel part 200 performs OFF-RS (real-time sensing). That is, RS (real-time sensing) is performed for each pixel, and data calculated through compensation and stored in the second memory 110 is converted into an LVDS data format and output. The converter 210 stores the received data in the first memory 220 or 420.

Although preferred embodiments of the present invention have been described above, those skilled in the art will appreciate that various modifications and variations can be made in the present invention without departing from the spirit or scope of the present invention disclosed in the appended claims.

What is claimed is:

1. An organic light-emitting display device comprising:
    a panel part including a display panel in which a plurality of data lines, a plurality of gate lines and a plurality of sub-pixels are arranged, a data driver for driving the data lines, and a gate driver for driving the gate lines; and
    a timing control circuit configured to output a signal for controlling the data driver and the gate driver of the panel part,
    wherein the data driver comprises:
    a first memory configured to store data including display panel compensation data; and
    a converter configured to perform communication with the timing control circuit through a long-distance signal transmission system, to convert a signal provided from the timing control circuit and transmit the converted signal to the first memory, and to convert a signal provided from the first memory and transmit the converted signal to the timing control circuit.

2. The organic light-emitting display device according to claim 1, wherein the long-distance signal transmission system is Low-voltage differential signaling LVDS.

3. The organic light-emitting display device according to claim 1, wherein the first memory is a NAND type flash memory.

4. The organic light-emitting display device according to claim 1, wherein the converter comprises:
    a memory control circuit for controlling the first memory;
    an encoder for encoding data according to a control signal provided from the memory control circuit;
    a decoder for decoding data according to a control signal provided from the memory control circuit;
    a serializer for converting parallel electric signals into serial electric signals in a long-distance signal transmission format in order to transmit data to the timing control circuit; and
    a de-serializer for converting serial electric signals received from the timing control circuit through the long-distance signal transmission system into parallel electric signals.

5. The organic light-emitting display device according to claim 4, wherein the converter receives sensing data of sub-pixels, provided through the data driver of the panel part.

6. An organic light-emitting display device comprising:
    a panel part including a display panel in which a plurality of data lines, a plurality of gate lines and a plurality of sub-pixels are arranged, a data driver for driving the data lines and a gate driver for driving the gate lines;
    a timing control circuit configured to output a signal for controlling the data driver and the gate driver of the panel part; and
    a bridge circuit board including a first memory configured to store data including display panel compensation data, and a converter configured to perform communication with the timing control circuit through a long-distance signal transmission system, to convert a signal provided from the timing control circuit and transmit the converted signal to the first memory, and to convert a signal provided from the first memory and transmit the converted signal to the timing control circuit.

7. The organic light-emitting display device according to claim 6, wherein the long-distance signal transmission system is Low-voltage differential signaling LVDS.

8. The organic light-emitting display device according to claim 6, wherein the first memory is a NAND type flash memory.

9. The organic light-emitting display device according to claim 6, wherein the converter comprises:
    a memory control circuit for controlling the first memory;
    an encoder for encoding data according to a control signal provided from the memory control circuit;
    a decoder for decoding data according to a control signal provided from the memory control circuit;
    a serializer for converting parallel electric signals into serial electric signals in a long-distance signal transmission format in order to transmit data to the timing control circuit; and
    a de-serializer for converting serial electric signals received from the timing control circuit through the long-distance signal transmission system into parallel electric signals.

10. The organic light-emitting display device according to claim 9, wherein the converter receives sensing data of sub-pixels, provided through the data driver of the panel part.

11. The organic light-emitting display device according to claim 9, wherein the converter receives temperature sensing data provided from a temperature sensor included in the panel part.

12. The organic light-emitting display device according to claim 9, wherein the organic light-emitting display device further includes a second memory connected to the timing control circuit for storing data provided from the converter.

13. The organic light-emitting display device according to claim 12, wherein the second memory is a NAND type flash memory.

14. The organic light-emitting display device according to claim 13, wherein, when the converter receives a reset signal, the converter compares a checksum of data stored in the first memory with a checksum of data stored in the second memory, and when there is a difference between the checksums, stores the data of the first memory in the second memory.

15. The organic light-emitting display device according to claim 13, wherein the converter reads final data stored in the second memory and stores the final data in the first memory upon reception of a power off control signal from the timing control circuit.

16. A data processing method of an organic light-emitting display device including a panel part including a display panel in which a plurality of data lines, a plurality of gate lines and a plurality of sub-pixels are arranged, a data driver for driving the data lines and a gate driver for driving the gate lines; and a timing control circuit outputting a signal for controlling the data driver and the gate driver of the panel part, the panel part including a first memory for storing data including display panel compensation data and a converter for controlling data communication with the timing control circuit, the data processing method comprising:

an initialization step of converting display panel compensation data of the organic light-emitting display device, stored in the first memory, into data of a long-distance signal transmission system, and transmitting the converted data to a second memory of the timing control circuit when the converter recognizes a booting mode of the timing control circuit due to timing control circuit change; and a data processing step of receiving a control signal from the timing control circuit, and performing an operation corresponding to the control signal by the converter.

17. The data processing method according to claim 16, wherein the initialization step comprises:

comparing checksum of data stored in the first memory and checksum of data stored in the second memory, converting the data stored in the first memory into data of the long-distance signal transmission system when the checksums are different from each other, and transmitting the converted data to the second memory of the timing control circuit.

18. The data processing method according to claim 16, wherein the data processing step comprises transmitting sensing data of sub-pixels, provided through the data driver of the panel part, to the timing control circuit.

19. The data processing method according to claim 16, wherein the data processing step comprises transmitting temperature sensing data provided from a temperature sensor included in the panel part to the timing control circuit.

20. The data processing method according to claim 16, wherein the data processing step comprises:

receiving data converted into data of the long-distance signal transmission system by the timing control circuit and stored in the second memory, and storing the received data in the first memory when the converter receives a power off control signal from the timing control circuit.

* * * * *